United States Patent
Drapkin et al.

(10) Patent No.: US 6,215,341 B1
(45) Date of Patent: Apr. 10, 2001

(54) DECELERATION CIRCUIT

(75) Inventors: Oleg Drapkin, North York; Grigori Temkine, Toronto, both of (CA)

(73) Assignee: ATI International Srl, Christchurch (BB)

( * ) Notice: Subject to any disclaimer, the term of this patent is extended or adjusted under 35 U.S.C. 154(b) by 0 days.

(21) Appl. No.: 09/351,096

(22) Filed: Jul. 9, 1999

(51) Int. Cl.⁷ .................................................. H03B 1/00

(52) U.S. Cl. ......................... 327/112; 327/312; 327/379; 327/544

(58) Field of Search ...................... 326/26, 27; 327/108, 327/111, 112, 310, 311, 313, 379, 382, 389, 391, 551, 383, 544

(56) References Cited

U.S. PATENT DOCUMENTS

| 5,367,210 | * | 11/1994 | Lipp ........................................ 326/26 |
| 5,654,981 | * | 8/1997 | Mahant-shetti et al. ............. 327/108 |
| 5,659,261 | * | 8/1997 | Bacrania et al. ..................... 327/112 |
| 5,760,620 | * | 6/1998 | Doluca ................................. 327/112 |

* cited by examiner

Primary Examiner—Kenneth B. Wells
Assistant Examiner—Paul Dinh
(74) Attorney, Agent, or Firm—Markison & Reckamp, P.C.

(57) ABSTRACT

A deceleration circuit is operatively coupled to a first and second voltage to reduce noise on each of the voltage lines. For example, one voltage may be a supply voltage and the other voltage may be at a ground potential. The deceleration circuit may be coupled, for example, to each circuit that need not operate at a maximum or high operational speed within an integrated circuit that has other circuits that require high speed operation.

15 Claims, 2 Drawing Sheets

DECELERATION CIRCUIT

FIELD OF THE INVENTION

The invention relates generally to circuits and methods for reducing noise on voltage lines, and more particularly to deceleration circuits and methods for circuits that are operatively coupled between a first and second voltage.

BACKGROUND OF THE INVENTION

There is a constant challenge to continuously design smaller, faster and more complicated integrated circuits to provide increased functionality and speed for multimedia applications and other applications. Newer technological processes have been designed to allow fast CMOS transistor operation. However, a resultant problem with integrated circuits having, for example, large numbers of transistors, is that the faster more and more CMOS transistors switch, the more likelihood of increased ground and power bounce or noise. The problem of ground and power bounce becomes increasingly difficult when millions of transistors are fabricated to operate at much higher speeds. The ground and power bounce can result, for example, from the switching current resultant from the switching of various circuits within an integrated circuit. In addition, it would be desirable to have a circuit and method that efficiently decelerated those circuits that do not require higher operational speeds.

One solution to decrease the effect of ground and power bounce has been not to use strong transistors if it is not critical for the chip performance. That means to use smaller width and longer length CMOS transistors for some circuits within an integrated circuit. For example, the slower circuits may use small width and longer length CMOS transistors to reduce the ground and power bounce. However, as the length of the CMOS transistor increases, it produces a larger input capacitor, parasitic capacitance. That means the previous stage has to be stronger to charge and discharge the next stage input capacitor. In addition, with smaller width devices, there is a technological size limit as to how small the width can be.

Consequently there exists a need for a circuit and method that can reduce the switching current resulting from higher speed transistors that is relatively simple and low cost in nature. A desired solution should not require increasing a length of a CMOS transistor nor decreasing the width of a CMOS transistor.

BRIEF DESCRIPTION OF THE DRAWINGS

The invention will be more readily understood in view of the below drawings, wherein.

DETAILED DESCRIPTION OF A PREFERRED EMBODIMENT OF THE INVENTION

Briefly, a deceleration circuit is operatively coupled to a first and second voltage to reduce noise on each of the voltage lines and to decelerate a switching process. For example, one voltage may be a supply voltage and the other voltage may be at a ground potential. The deceleration circuit may be coupled, for example, to each circuit that need not operate at a maximum or high operational speed within an integrated circuit that has other circuits that require high speed operation.

In one embodiment, a deceleration circuit is operatively coupled between a circuit to be decelerated and the first voltage. A second deceleration circuit is operatively coupled to the first deceleration circuit and to the second voltage level wherein the voltage level of the first voltage is higher than the second voltage. It will be recognized by one of ordinary skill in the art that the disclosed deceleration circuits may be applied to any suitable analog or digital stages.

Figure 1:
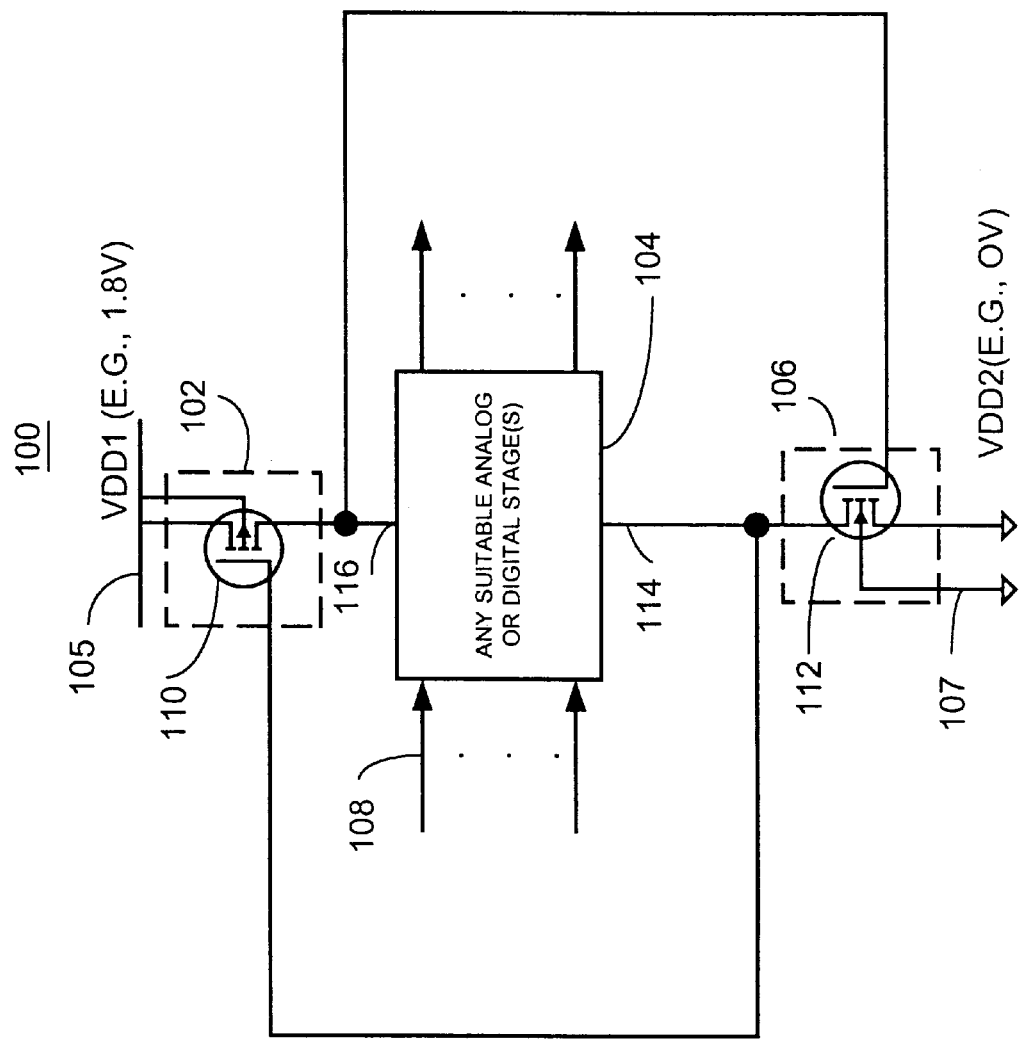
FIG. 1 is a circuit diagram illustrating one example of a deceleration circuit in accordance with one embodiment of the invention.

FIG. 1 illustrates one example of a deceleration circuit 100 having a first deceleration circuit 102 operatively coupled between a circuit 104 to be decelerated, and to a first voltage 105, such as a supply voltage for the circuit 104, or any other suitable voltage. The deceleration circuit 100 also includes a second deceleration circuit 106 operatively coupled to the first deceleration circuit 102 and to a second voltage 107 wherein the voltage level of the first voltage 105 is higher than the voltage level of the second voltage 107. For purposes of illustration, this embodiment illustrates that the first voltage may be, for example, 1.8 V, or any other suitable voltage, and the second voltage 107 may be at a ground potential, or any other suitable voltage.

The circuit 104 may be any suitable analog or digital stage, having one or more inputs 108 and one or more outputs 110. Where the circuit 104 is a digital circuit, it may receive one or more digital input voltages and output one or more analog or digital output voltages. The circuit 104 may also receive one or more analog voltages and output one or more analog or digital outputs. In the case where the circuit 104 is a digital stage, the circuit may include, for example, AND gates, OR gates, NAND gates, flip flops, or any other suitable digital circuitry.

The first voltage 105 may be, for example, a supply voltage for a die that is coupled to a printed circuit board supply voltage, for example, through a metal connection of some type. Similarly, the second voltage 107 may be a ground voltage of a die that is operatively coupled to a PC board ground pin, pad, wire or trace.

In one embodiment, the first deceleration circuit 102 may include a transistor 110, such as a pmos transistor or other transistor operatively coupled to provide a resistance and capacitance to filter the first voltage 105 to the circuit 104 and to decelerate switching process. In this example, the parasitic capacitance and channel resistance of the pmos transistor 110 helps serve to filter noise from the first voltage 105 as well as to decelerate the switching process because of decreasing circuit 104 voltage supply during transient process. Also in this example, the second deceleration circuit also includes a transistor 112, such as an nmos transistor, that is operatively coupled to filter the second voltage 107 from the circuit 104 as well as to increase circuit 104 "ground" supply during transient process. In this example, transistor 110 has a terminal, such as a source, coupled to the first voltage and a second terminal, such as a gate, operatively coupled to a terminal, such as a drain, of transistor 112. The transistor 110 also has its gate operatively coupled to a sink terminal 114 of the circuit 104. The transistor 110 has a third terminal operatively coupled to a source terminal 116 of the circuit 104 (terminal such as a drain of transistor 110) that is also coupled to a terminal, such as a gate, of transistor 106. The second deceleration circuit 106 when implemented as a transistor, also has a terminal, such as a source, operatively coupled to the second voltage 107.

The first and second deceleration circuits in this embodiment utilize a single transistor operatively coupled to reduce the supply voltage noise to the circuit during normal operation of the circuit and to decelerate switching process. However, any suitable device or devices may be used.

The transistor 110 effectively uses its parasitic capacitance and channel resistance to filter noise encountered on the voltage on line 105. Similarly, the second deceleration circuit utilizes a parasitic capacitance and channel resistance of an N channel transistor to filter noise on the second voltage 107. The coupling of the two devices through two feedback paths, such as the input or gate of both devices being operatively coupled to a drain of the other device, also increases the parasitic capacitance for each voltage such that both deceleration circuits work in combination to reduce noise. A result of the circuit is to effectively decelerate the circuit 104 or reduce the speed of the circuit 104 since a voltage drop occurs across channel resistors of each of the deceleration circuits, thereby reducing the supply voltage to the circuit 104 during transient process. With temporally (dynamically) lower circuit 104 voltage supply it will switch slower. The parasitic capacitance of the deceleration circuit is used as a short storage mechanism to minimize power and ground bounces.

Accordingly, the deceleration circuits 102 and 106 can significantly decrease power bounce, particularly if used in millions of circuits within an integrated circuit. The combination of this filtering along the voltage lines can significantly reduce ground and power bounces without requiring the length and width modifications to the gates of circuit(s) 104. Although the deceleration circuit may be used in any suitable circuit, it may be used in data switching circuits and control signal receiving and generation circuits that do not require the high speed operation compared with other circuits on the die that may require higher speed operation. The deceleration circuits 102 and 106 are always effectively "on" but do not draw DC current.

Figure 2:
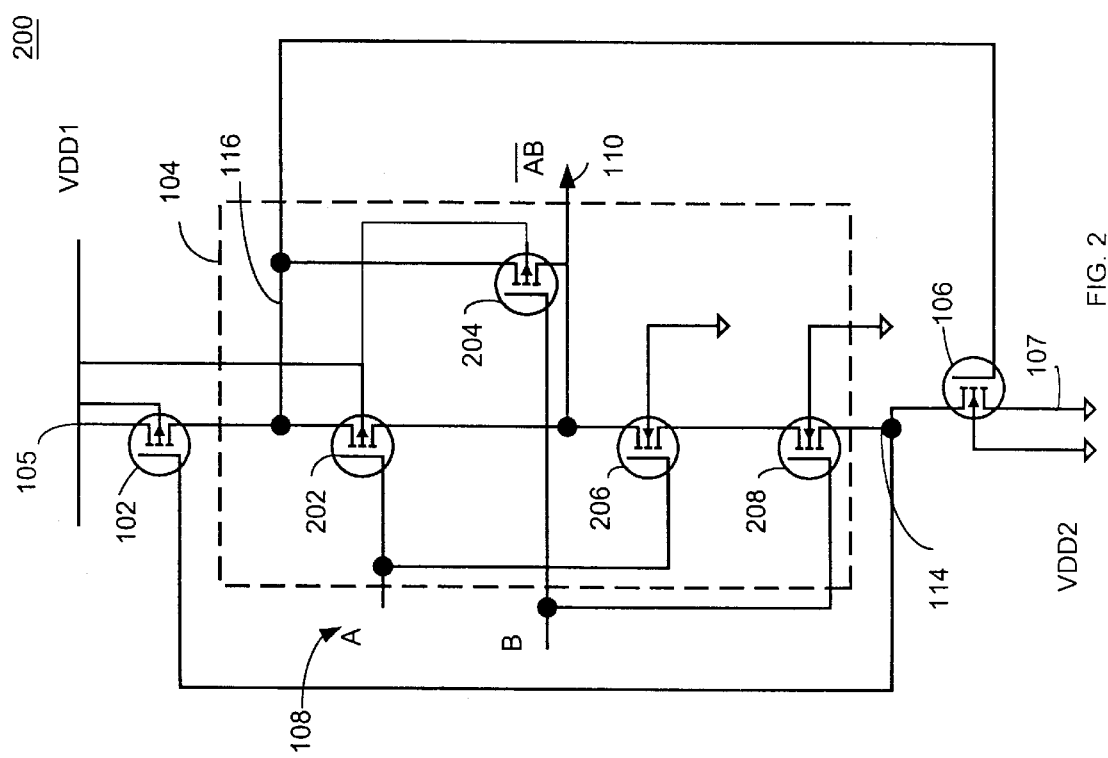
FIG. 2 is a circuit diagram illustrating one example of a deceleration circuit coupled to a NAND gate, in accordance with one embodiment of the invention.

FIG. 2 illustrates a particular application of the circuit of FIG. 1 as applied to a NAND gate. In this embodiment, the NAND gate includes pmos transistors 202 and 204, and nmos transistors 206 and 208. These transistors are operatively coupled to provide a dual input NAND gate, as known in the art. In this example, the first voltage may be, for example, 1.8 V and the second voltage may be, for example, 0 V.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A deceleration circuit for a circuit operatively coupled between a first voltage and a second voltage comprising:
    a first deceleration circuit operatively coupled between the circuit to be decelerated and the first voltage; and
    a second deceleration circuit operatively coupled to the circuit to be decelerated and to the second voltage;
    a first feedback path between the first deceleration circuit and the second deceleration circuit;
    a second feedback path between the first deceleration circuit and the second deceleration circuit such that the first and second deceleration circuits operate in combination to reduce a supply voltage, based on the first and second voltage, to the circuit;
    and wherein the voltage level of the first voltage is higher than the second voltage.

2. The deceleration circuit of claim 1 wherein the first deceleration circuit includes at least one transistor operatively coupled to filter the first voltage to the circuit, and wherein the second deceleration circuit includes at least one transistor operatively coupled to filter the second voltage.

3. The deceleration circuit of claim 1 wherein the first deceleration circuit includes at least a first transistor having a first terminal operatively coupled to the first voltage, a second terminal operatively coupled to both a first terminal of the second deceleration circuit and to a sink terminal of the circuit, and a third terminal operatively coupled to a source terminal of the circuit and to a second terminal of the second deceleration circuit, and wherein the second deceleration circuit includes at least a second transistor having a third terminal operatively coupled to the second voltage.

4. The deceleration circuit of claim 1 wherein the first deceleration circuit includes at least a first transistor, and wherein the second deceleration circuit includes at least a second transistor such that the first transistor and the second transistor are operatively coupled to reduce a supply voltage to the circuit during normal operation of the circuit.

5. The deceleration circuit of claim 3 wherein the first transistor is a pmos transistor and wherein the second transistor is an nmos transistor.

6. The deceleration circuit of claim 5 wherein the circuit receives at least one digital input signal.

7. The deceleration circuit of claim 5 wherein the circuit receives at least one analog input signal.

8. The deceleration circuit of claim 1 wherein the first voltage is a supply voltage to the circuit and wherein the second voltage is a ground potential for the circuit.

9. The deceleration circuit of claim 1 wherein the first deceleration circuit is operatively coupled to reduce switching noise on the first voltage and wherein the second deceleration circuit is operatively coupled to filter noise on the second voltage.

10. A deceleration circuit for a circuit operatively coupled between a first voltage and a second voltage comprising:
    a first deceleration circuit including a pmos transistor operatively coupled between the circuit to be decelerated and the first voltage to reduce a supply voltage to the circuit during normal operation of the circuit to be decelerated; and
    a second deceleration circuit including an nmos transistor operatively coupled to the pmos transistor through a first and second feedback path and operatively coupled to the circuit to be decelerated and to the second voltage;
    such that the first and second deceleration circuits operate in combination to reduce the supply voltage, based on the first and second voltage, to the circuit;
    and wherein a difference between the first and second voltage is higher than a threshold voltage Vtp and Vtn of the pmos and nmos transistors.

11. The deceleration circuit of claim 10 wherein:
    the pmos transistor has a source operatively coupled to the first voltage, a gate operatively coupled to both a drain of the nmos transistor and to a terminal of the circuit that operatively receives the second voltage, and a drain that is operatively coupled to the both a gate of the nmos transistor and to a terminal of the circuit that operatively receives the first voltage; and wherein
    the nmos transistor includes a source operatively coupled to the second voltage.

12. The deceleration circuit of claim 11 wherein the circuit receives at least one digital input signal.

13. The deceleration circuit of claim 11 wherein the circuit receives at least one analog input signal.

14. The deceleration circuit of claim 11 wherein the first voltage is a supply voltage for the circuit and wherein the second voltage is a ground potential for the circuit.

15. The deceleration circuit of claim 14 wherein the first deceleration circuit is operatively coupled to reduce switching noise on the first voltage and wherein the second deceleration circuit is operatively coupled to filter noise on the second voltage.

* * * * *